United States Patent [19]

Kyomasu et al.

[11] Patent Number: 4,839,735
[45] Date of Patent: Jun. 13, 1989

[54] SOLID STATE IMAGE SENSOR HAVING VARIABLE CHARGE ACCUMULATION TIME PERIOD

[75] Inventors: Mikio Kyomasu; Hitoshi Tanaka; Seiichiro Mizuno, all of Hamamatsu, Japan

[73] Assignee: Hamamatsu Photonics K.K., Shizuoka, Japan

[21] Appl. No.: 135,382

[22] Filed: Dec. 21, 1987

[30] Foreign Application Priority Data

| Dec. 22, 1986 [JP] | Japan | 61-306048 |
| Dec. 25, 1986 [JP] | Japan | 61-309499 |
| Dec. 25, 1986 [JP] | Japan | 61-309498 |
| Dec. 25, 1986 [JP] | Japan | 61-309500 |
| Apr. 12, 1987 [JP] | Japan | 62-89606 |
| May 15, 1987 [JP] | Japan | 62-118280 |
| Jul. 13, 1987 [JP] | Japan | 62-174532 |

[51] Int. Cl.$^4$ .............................. H04N 3/14
[52] U.S. Cl. .................. 358/213.31; 358/213.19; 358/213.11; 357/30
[58] Field of Search ............ 358/213.11, 213.26, 358/213.12, 213.31, 213.18, 294; 357/24 LR, 30 H

[56] References Cited

U.S. PATENT DOCUMENTS

| 3,562,418 | 2/1971 | Glusick et al. | 358/213.31 |
| 4,363,963 | 12/1982 | Ando | 358/213.18 |
| 4,395,736 | 7/1983 | Fraleux | 358/213.31 |
| 4,646,155 | 2/1987 | Miyazawa et al. | 358/213.11 |
| 4,680,477 | 7/1987 | Sato et al. | 357/30 H |
| 4,682,236 | 7/1987 | Wang et al. | 358/213.26 |

Primary Examiner—Jin F. Ng
Assistant Examiner—Stephen Brinich
Attorney, Agent, or Firm—Finnegan, Henderson, Farabow, Garrett, & Dunner

[57] ABSTRACT

A solid state image sensor in which the charge accumulation period of each picture element can be set at the same point of time. Additionally, the lenngth of the charge period can be set at will, thus providing a video signal picture in which all picture elements bear image information with the same time reference. Sensitivity of the solid state image senosr can be adjusted by setting the length of charge accumulation period. In the solid state image sensor, photodiodes are disposed as picture elements, and video signal is output in accordance with a charge which is light-generated within respective photodiodes. A series circuit of a switch and a capacitance element is connected in parallel with the photodiode. The switch is closed for at least the charge accumulation period during which charge is light-generated within the photodiode, and the video signal is obtained in accordance with level of charging of said capacitance element.

31 Claims, 12 Drawing Sheets

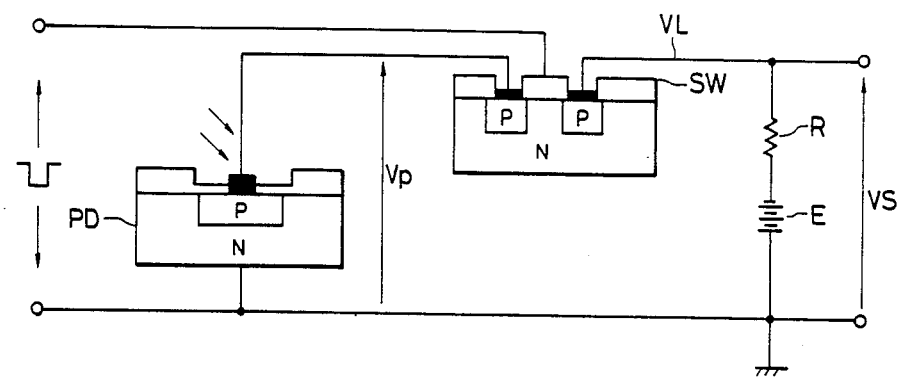
FIG. 1
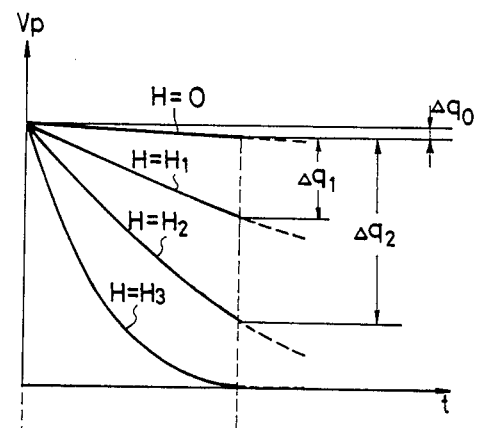
FIG. 2(a)
FIG. 2(b)
FIG. 2(c)
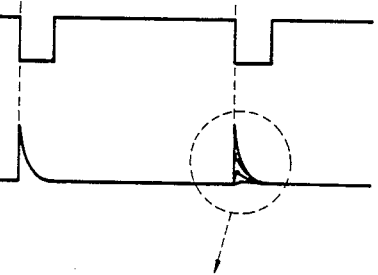
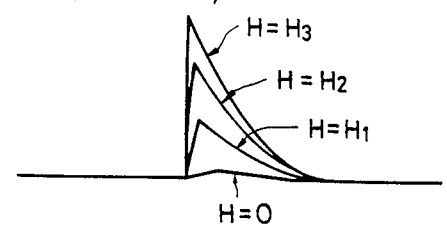
FIG. 2(d)

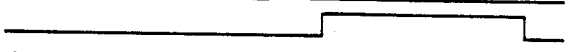
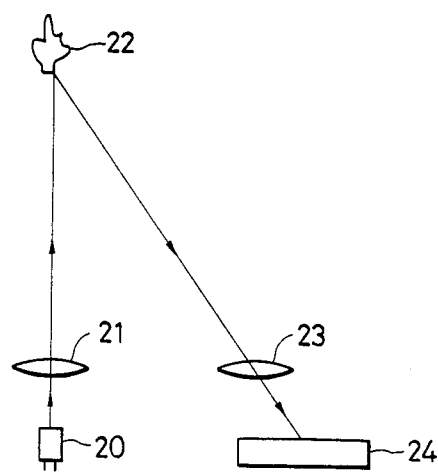
FIG. 17

SOLID STATE IMAGE SENSOR HAVING VARIABLE CHARGE ACCUMULATION TIME PERIOD

BACKGROUND OF THE INVENTION

1. Field of the Invention

The present invention relates to a solid state image sensor having cells capable of accumulating a charge, each accumulating cell of which accumulates a charge in accordance with the intensity of a corresponding picture element.

2. Description of Related Art

FIG. 1 shows a fundamental structure of a picture element of a conventional MOS type image sensor. A photodiode PD is connected through a MOSFET switch SW to a video line VL which outputs a video signal. The video line is connected to a negative supply E via a resistor R, and the video signal is obtained in the form of voltage variation across the resistor R. The voltage variation is caused by charging current when photodiode PD is charged by negative supply E through switch SW. The charging current is dependent on the amount of charge which is generated within photodiode PD.

Photodiode PD is initially charged by negative supply E at a scan timing and is reverse biased. Photodiode PD then receives light to generate a charge within photodiode PD until its next scan timing. As a result, the charge received during a previous scan is neutralized by the light-generated charge and the reverse voltage Vp, shown in FIG. 2(a), decreases in accordance with the amount of light received during one period of scan timing. For example, when no light is present, the voltage drop $\Delta q_0$ is caused by dark current. When the amount of light received is increased, the voltage drop $\Delta q_1$ or $\Delta q_2$ is caused by light-generated charge. When the amount of light received becomes great, the voltage drop saturates. Thus, the reverse voltage Vp is dependent on the amount of light received, dark current, and the scan period during which charge is accumulated. When the switch is turned ON by scan timing, photodiode PD is again charged by the negative supply E and the reverse voltage of negative supply E. At this time, the charging current varies in accordance with the voltage drop across photodiode PD as shown in FIG. 2(d).

Consequently, the charging current varies in accordance with the amount of light received by photodiode PD during one scan period. However, the video lines have distributive capacitance or stray capacitance, and are therefore equivalent to having the video line capacitance connected in parallel with photodiode PD. Thus, the charging current flowing out of negative supply E during the scanning is lower than when the video line capacitance is not existent.

FIG. 3 shows a partial pattern of one picture element. Photodiode PD is formed in the diffusion layer of an aperture 90, and a capacitance portion is formed including another diffusion portion. Connected to photodiode PD is a MOSFET switch SW. P-type diffusion layers form a source 92 and a drain 93, respectively, and are formed on an N-type substrate 91. A gate is designated by 94. Drain 93 is connected to a video line VL through polysilicon 95. The video line capacitance includes the stray capacitance formed by polysilicon 95, the diffusion capacitance of drain 93, and the stray capacitance formed by the aluminum video line VL.

Conventional MOS image sensors, as described above, have a drawback that the level of the video signal is lowered by the video line capacitance, thus causing lower sensitivity. In addition, since the photodiode of each picture element is charged sequentially with a fixed scan period during which the charging current is detected as a video signal, the point of time of scanning each picture element is different from the others depending on when in one scan cycle the picture element is scanned.

Consequently, the timing for the sample-and-hold of the video signal varies from one picture element to another, causing a problem that the video signal can not be obtained with charges of all picture elements accumulated with respect to the same time reference. If the video signal can not be obtained with charges of all picture elements accumulated with respect to the same time reference, then a spike is produced in the video signal of light sources such as fluorescent lamps whose intensities vary greatly in much shorter periods than the scan period, thus causing problems in measuring average brightness.

SUMMARY OF THE INVENTION

Accordingly, it is an object of the present invention to solve the aforementioned problems and to provide a solid state image sensor in which the charge accumulation period of each picture element can be set with respect to a single time reference.

It is a further object to provide a solid state image sensor in which the length of the charge period is variable, thus providing a video signal picture element which is in synchronism with other picture elements i.e., all picture elements bearing image information with the same time reference.

A still further object of the invention is to provide a solid state image sensor whose sensitivity is capable of being adjusted by setting the length of the charge accumulation period.

The above and other objects are achieved by a solid state image sensor in which photodiodes are disposed as picture elements. and a video signal is output in accordance with a charge which is light-generated within the respective photodiodes. A series circuit of a switch and a capacitance element is connected in parallel with the photodiode, and the switch is closed for at least a charge accumulation period during which a charge is light-generated within the photodiode. The video signal is obtained in accordance with the level of charging of the capacitance element.

The accompanying drawings, which are incorporated in and constitute a part of this specification, illustrate one embodiment of the invention and, together with the description, serve to explain the principles of the invention.

BRIEF DESCRIPTION OF THE DRAWINGS

FIG. 1 is a diagram showing a pertinent portion of one picture element of a conventional MOS type image sensor;

FIGS. 2(a) through 2(d) show waveforms of dynamic characteristics of the image sensor shown in FIG. 1;

FIGS. 16(a) through 16(f) are timing charts of reset signal RST, internal start pulse ISP, output signal RO of a shift register, information accumulation signal DT, read out signal SP, and clock signal CK, respectively;

FIG. 17 is a general arrangement of a conventional distance measurement mechanism using light sources for projection;

DESCRIPTION OF THE PREFERRED EMBODIMENTS

Reference will now be made in detail to the present preferred embodiments of the invention, examples of which are illustrated in the accompanying drawings.

Figure 3A:
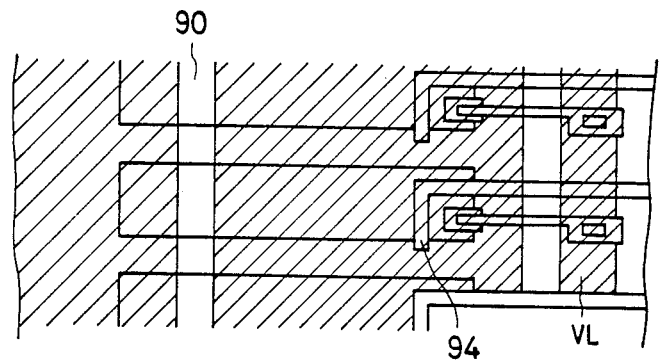
FIG. 3(a) is a top view showing the structure of the image sensor shown in FIG. 1.
Figure 3B:
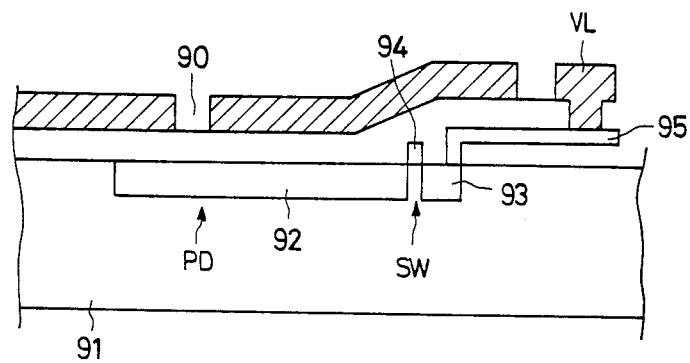
FIG. 3(b) is a cross sectional view of the image sensor shown in FIG. 1.
Figure 4:
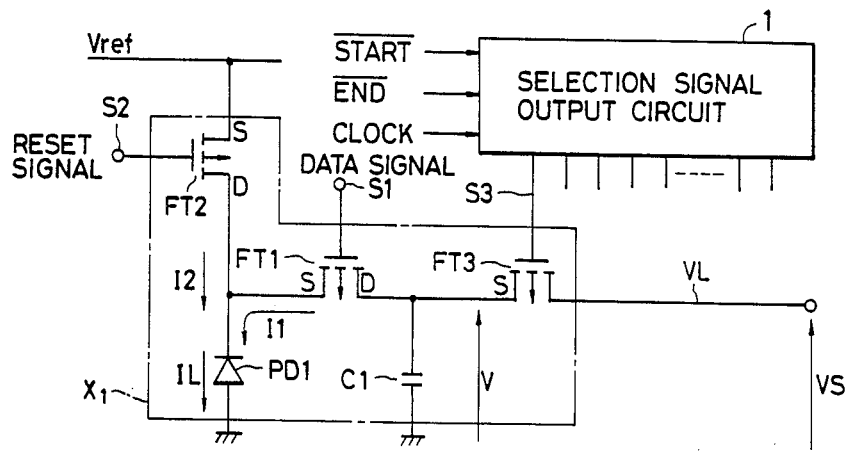
FIG. 4 is a schematic diagram showing circuit connections of a detector cell of a solid state image sensor according to the invention.
Figure 6:
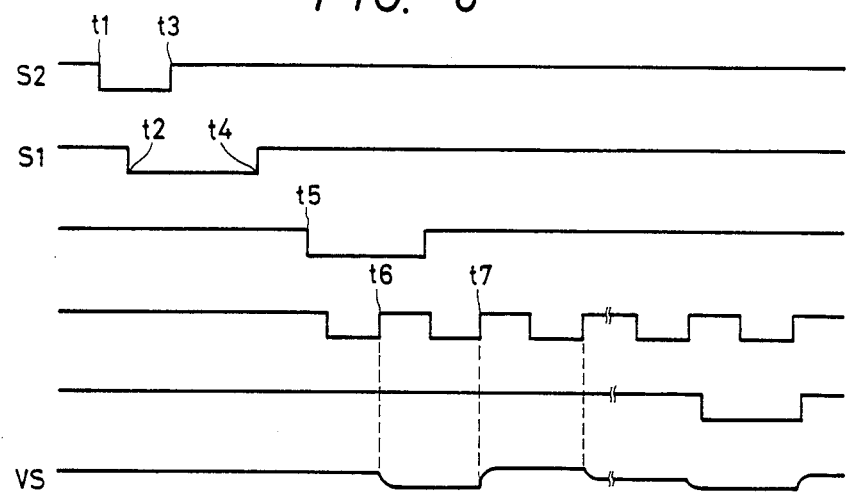
FIG. 6 is a timing chart showing the operation of the circuit of the embodiment in FIG. 4.

FIG. 4 is an electrical circuit diagram showing the arrangement of one picture element of a MOS solid state image sensor. The cathode of a photodiode PD1 is connected to the drain of an enhancement type MOS-FET switch element (referred to as switch element hereinafter) FT2 and the anode of the photodiode is grounded. A positive reference voltage Vref is applied to the source of switch FT2. The cathode of photodiode PD1 is connected to the source of an enhancement type switch FT1, the drain of which is connected to one terminal of a capacitance element C1. The other terminal of capacitance element C1 is grounded. Capacitance element C1 is formed of a MOS type capacitance element. Switch element FT1 and capacitance element C1 are connected in series and the series circuit is connected across photodiode PD1. Further, the anode of capacitance element C1 is connected to the source of an enhancement type switch element FT3, the drain of which is connected to a video line Vl. An active-low reset signal S2 is applied to the gate of switch element FT2 to conduct when the reset signal S2 goes low. Switch FT1 is applied an active-low data signal S1 to its gate to conduct when data signal S1 goes low. Switch FT3 is applied a select signal S3 to its gate to conduct when select signal 53 goes low. With this arrangement, when reset signal S2 goes low at time t1, as shown in the timing chart shown in FIG. 6, switch FT2 conducts to apply a reverse voltage of Vref across photodiode PD1. Then, at time t2 data signal S1 goes low, and switch FT1 conducts. Capacitance element C1 is also charged and the voltage across it is Vref. At this time, a photoelectric current IL caused by photodiode PD flows from the supply source of Vref to ground through switch FT2 and photodiode PD1. Then, at time t3 reset signal S2 goes high to cause switch FT2 to go OFF, leaving only switch FT1 ON.

Photoelectric current IL caused by photodiode PD1 flows, as shown by I1, through a closed circuit defined by capacitance element C1, switch element FT1, and photodiode PD1. Consequently, capacitance element C1 is charged reversely by photoelectric current IL and the voltage V across capacitance element C1 decreases gradually from initial voltage Vref. Next, at time t4 data signal S1 goes high causing switch FT1 to be OFF, and the reverse charging by photoelectric current IL into capacitance element C1 ceases, thereby causing voltage V across capacitance element C1 to stop increasing. In this manner, the voltage across capacitance element C1 varies in accordance with the amplitude of photoelectric current IL and the length of the period (time t3 to time t4) during which capacitance element C1 is charged reversely i.e., the accumulation period of charge.

At time t5, a start signal is applied to a select signal output circuit 1, which is a shift register, which outputs select signal S3 sequentially to switch element FT3 of respective picture elements. The shift register is adapted to initially preset one digit to "0" and the remaining digits to "1". The "0" is transferred from lower bits to higher bits in synchronism with the clock signal. At time t6 active-low select signal S3 is output, in synchronism with the clock signal, to the gate of switch FT3 of the first picture element to cause switch FT3 to be ON for one clock period, and voltage V across capacitance element C1 of the first picture element is output to video line VL.

At time t7, active-low select signal S3 is output, in synchronism with the clock signal, to the gate of switch element FT3 of the second picture element to cause switch element FT3 to be ON for one clock period, and voltage V across capacitance element C1 is output to video line V. In this manner, the scan continues toward the last picture element and thus voltage V across capacitance element C1 of each picture element is output to video line VL in sequence to obtain video signal VS. When the scanning across all picture elements is complete, an end signal is output to the select signal output circuit to stop the scan. Thereafter, the above-mentioned process is repeated for next cycle starting from time t1. In the process described above, applying the initial voltage to photodiode PD1 and capacitance element C1 during time periods t1 through t4 and accumulating charge caused by the photoelectric current are carried out across all picture elements at the same time.

As a result, video signals VS that are sequentially output, represent image information having the same reference time. Further, accumulating the charge across capacitance element C1 prevents a saturation of charge and allows for a long charge accumulation period for improved sensitivity. Further, after the charge accumulation period is over and switch element FT1 is off, a signal for causing switch element FT2 to be ON may be applied to the gate of switch element FT2 to apply initial voltage Vref to photodiode PD1. Photoelectric current IL is thereby caused by photodiode PD1 to flow into the voltage supply rather than being accumulated in the elements such as photodiodes PD1 for the scan period during which the voltage across each capacitance element is output, thus preventing blooming.

Figure 5:
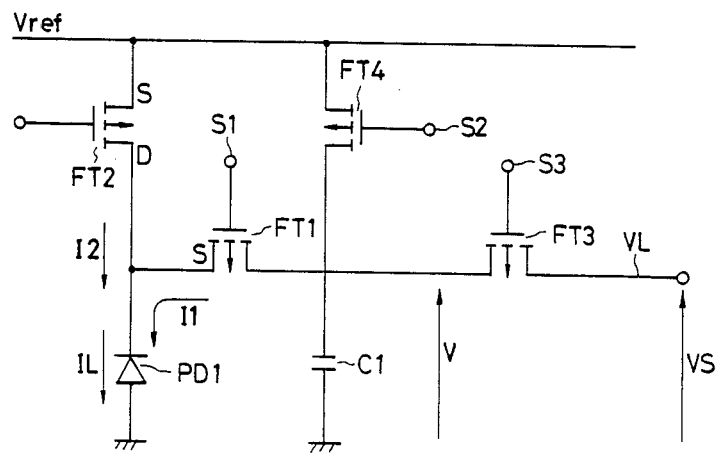
FIG. 5 is a schematic diagram showing a pertinent portion of one picture element of a solid state image sensor according to a second embodiment of the present invention.

Additionally, each picture element may also be arranged as shown in FIG. 5. In FIG. 5, switch element FT4 is provided between capacitance element C1 and the supply of voltage Vref, in which case switch element FT4 acts as a switch element for reset, and reset signal S2 is applied to the gate of switch element FT4. When switch element FT4 is ON, capacitance element C1 is charged to Vref, then switch element FT1 is ON to apply reverse voltage Vref across photodiode PD1. The period between the time at which switch FT4 goes off and the time at which switch element FT1 goes off is therefore the charge accumulation period.

When switch element FT1 goes off to terminate the charge accumulation period, the gate of switch element FT2 is applied a signal to cause switch element FT2 to conduct, thereby preventing blooming by applying reverse voltage Vref across photodiode PD1 during the scan period of capacitance element C1.

In the invention thus far described, a series circuit of a switch and a capacitance element is connected in parallel with a photodiode, the switch being closed for at least a time period for accumulating the charge that is light-generated within the photodiode. A video signal is obtained in accordance with the level of charging of the capacitance element, and thereby a video signal with a single time reference can be obtained. Also, the charge accumulated in the capacitance element is free from saturation and the charge accumulation period can be adjusted for improved sensitivity.

Figure 7:
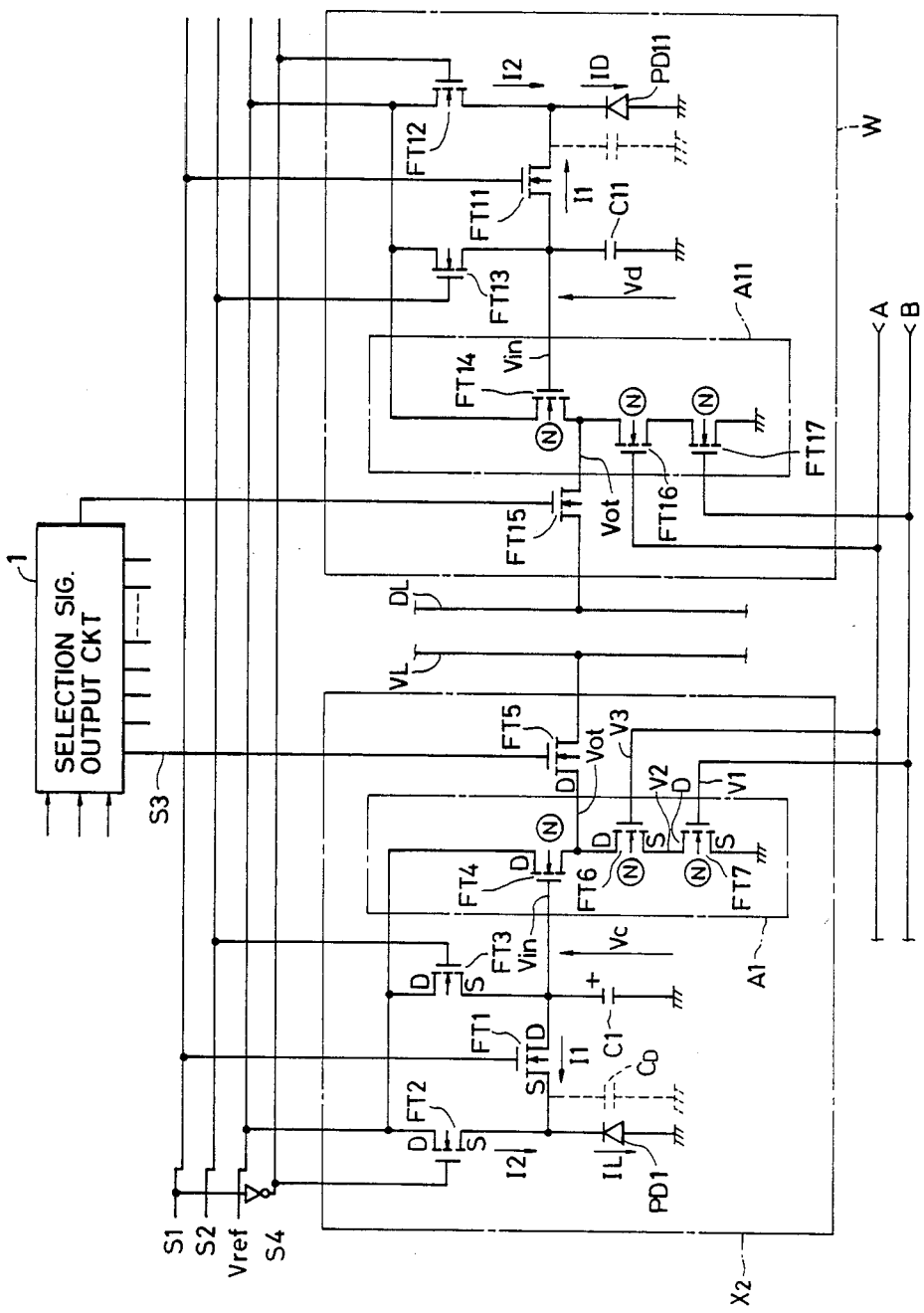
FIG. 7 is a schematic diagram showing a second embodiment of a detector cell of the invention.

FIG. 7 is a schematic diagram showing the pertinent portion of a MOS type solid state image sensor according to the present invention. In the drawing, a first detector cell X2 and a dummy cell W are shown. Each solid state image sensor is provided with one dummey cell. The following is a description of detector cell X2.

The cathode of photodiode PD1 is connected to the source of an enhancement type MOSFET (referred to simply as a transistor hereinafter) FT2 while the anode of photodiode DP1 is grounded and the drain of transistor FT2 is applied a positive reference voltage Vref. The cathode of photodiode PD1 is connected to the source of enhancement type transistor FT1 while the drain of transistor FT1 is connected to capacitance element C1, the other terminal of which is grounded. Capacitance element C1 is formed of a MOS type capacitance element. Transistor FT1 and capacitance element C1 form a series circuit which is connected across photodiode PD1.

The anode of capacitance element C1 is connected to the source of enhancement type transistor FT3 while the drain of transistor FT3 is applied reference voltage Vref. The anode of capacitance element C1 is then connected to the gate of non-doped enhancement type transistor FT4 which forms a sense amplifier circuit A1. The drain of transistor FT4 is applied voltage Vref while the source of transistor FT4 is connected to the drain of non-doped enhancement type transistor FT6 that forms a load resistor. The source of transistor FT6 is connected to the drain of non-doped enhancement type transistor FT7 and the source of transistor Ft7 is grounded. Both transistor FT6 and transistor FT7 are applied stable voltages to their gates. The source of transistor FT4 is connected to the drain of enhancement type transistor FT5 and the source of transistor FT5 is connected to video line VL.

Transistor FT3 is applied active-high reset signal S2 its gate and conducts when reset signal S2 goes high.

Transistor FT1 is applied active-high data signal S1 to its gate and conducts when the data signal goes high. Transistor FT5 is applied an active-high X2 select signal S3 to its gate and conducts when X2 select signal goes high. Further, transistor FT2 is applied a lock signal S4 which is an inversion of the data signal S1, and conducts when the lock signal S4 goes high.

Figure 8:
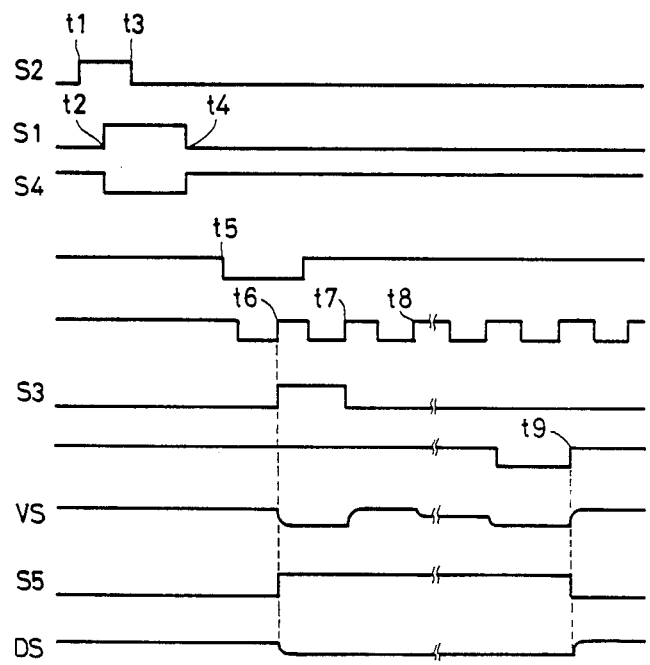
FIG. 8 is a timing chart showing the operation of the circuit of the embodiment shown in FIG. 7.

With this arrangement, when reset signal S2 goes high at time t1 as shown in FIG. 8, transistor FT3 conducts to charge capacitance element C1 to voltage Vref.

Since lock signal S4 is high level at time t1, photodiode PD1 is applied voltage Vref in the reverse direction at time t1. At time t2 data signal S1 goes high and lock-signal S4 goes low, thereby causing transistor FT1 to go on and transistor FT2 to go off.

Photodiode PD1 will continue to be applied voltage Vref in reverse direction through transistors FT1 and FT3. When reset signal S2 goes low at time t3, transistor FT3 goes off and only transistor FT1 continues to be on. Then, photoelectric current IL caused by photodiode PD1 charges the stray capacitance CD of the photodiode and it flows, as indicated by I1, through the closed circuit formed of capacitance element C1, transistor FT1 and the photodiode PD1. Capacitance element C1 is charged by a shunt portion of photoelectric current IL in the reverse direction and the voltage Vc across capacitance element C1 decreases gradually from its initial value Vref. The voltage Vc across C1 is proportional to IL·t and may be expressed by $Vc = Vref - IL \cdot t(C1 + C_D)$. The voltage Vc decreases as indicated by A1 in FIG. 10.

When data signal S1 goes low at time t4, transistor FT1 goes off, and the charging of capacitance element C1 by the shunt portion of photoelectric current Il in reverse direction stops. As a result, the decrease of the voltage the across capacitance element C1 stops. In this manner, voltage Vc across the capacitance element C1 varies in accordance with the base period (time t3 to time t4) during which the shunt portion of the photoelectric current IL charges the capacitance element C1 in the reverse direction, i.e., the length of the charge accumulation period.

When an active-low start signal is input to select signal output circuit 1, which is a shift register, select signal output circuit 1 outputs, in synchronism with the clock signal, the select signals in sequence to the gates of the transistor FT5 in respective cells. Each bit except one in the shift register is set to logic "0" initially and only one bit is set to logic "1". The bit set to logic "1" is transferred from lower bits to higher bits in synchronism with the clock signal. When select signal S3 is output at time t6 to the gate of transistor FT5 of a first detector cell X1 in synchronism with the clock signal, the transistor FT5 will be on for one clock period (time t6 to time t7), and the voltage Vc across the capacitance element C1 of the first detector cell X2 is output to the video line VL. Next, when the active-high select signal is output at time t7 to the gate of a transistor FT5 in a second cell in synchronism with the clock signal, the transistor FT5 will be on for one clock period (time t7 to t8), and the voltage Vc across the capacitance element C1 of the second detector cell is output to the video line VL. In this manner, the image sensor is scanned to the last cell and the voltage Vc across the capacitance element C1 of respective detector cells are output as video signal VS to video line VL.

When the scan proceeds to the last detector cell, an end signal is output to the select signal output circuit 1, then the scan stops at time t9. Thereafter, another cycle of scanning is repeated, restarting from time t1.

In the above processing, the accumulation process of the charge generated by photoelectric current during time t3 to t4 is carried out at one and the same point of time in respective detector cells. Therefore, video signal VS that is output in sequence will represent the amount of light received at the same point of time throughout the cells. In addition, the charge across the capacitance element C1 permits a large amount of charge to be accumulated for improved sensitivity. In the aforementioned embodiment, transistor FT2 is on, except during the charge accumulation period, due to the active-high lock signal S4. In this case, the photoelectric current IL caused by the photodiode PD1 is not accumulated across the photodiode PD1 except during the charge accumulation period, but instead flows into the supply as shown by I2, thereby preventing blooming.

A dummy cell W will be described as follows. Dummy cell W is of the same construction as the detector X2 except that the light incident upon an aperture portion 90 is intercepted by an aluminum layer 96. Transistors FT11, FT12, FT13, FT14, FT15, FT16, and FT17 of the dummy cell W correspond to transistors FT1, FT2, FT3, FT4, FT5, FT6 and FT7 of the detector cell X1. The dummy cell W operates in the same way as respective detector cells. A dark current ID caused by a photodiode PD11 during the charge accumulation period (t3 to t4) charges the inherent self capacitance of the photodiode and a capacitance element C11 in the reverse direction to cause the voltage across the capacitance element C11 to decrease. An active-high dummy cell select signal S5 is applied to the gate of the transistor FT15, signal S15 going high for the scan period during which respective cells are sequentially scanned to output the video signal VS. The voltage Vd across the capacitance element C11 of the dummy cell W is output as a dark signal DS to a dummy line DL during the scan period. Thus, by subtracting the dark signal DS from the video signal VS, the invention provides resultant video signal VS from which influences of dark current are eliminated.

A sense amplifier circuit A1 is a source follower and the transistors FT6 and FT7 form a constant current source.

The following relation is derived from the fact that the current through the transistor FT4 is equal to the current through the transistor FT7:

$$Vin - Vot - Vt4 = V3 - V2 - Vt6$$
$$= V1 - Vt7$$

where,

V1 is the gate voltage of the transistor FT7,
V2 is the source voltage of the transistor FT6,
V3 is the gate of the transistor FT6,
Vt4 is the threshold voltage of the transistor FT4,
Vt6 is the threshold voltage of the transistor FT6,
Vt7 is the threshold voltage of the transistor FT7,
Vin is the gate voltage of the transistor FT4, and
Vot is the source voltage of the transistor FT4.

The above equation can be rewritten as follows:

$$Vot = Vin - V1 - (Vt4 - Vt7)$$

The output voltage Vot of the transistor FT4 decreases by the gate voltage V1 of the transistor FT7 and depends as well on the difference between the threshold voltage of the transistor FT4 and the threshold voltage of the transistor FT7. Consequently, fabricating the transistors FT4 and FT7 with good consistency can make value of (VT4−VT7) zero, thereby providing consistent video signal outputs from respective detector cells, which is not dependent on the threshold voltage of the transistor FT4.

Figure 9B:
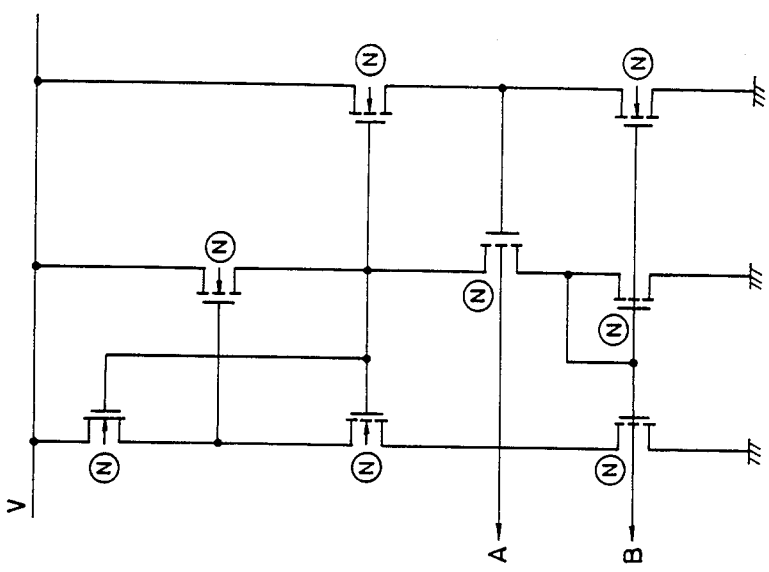
FIGS. 9(a) and 9(b) are schematic diagrams showing bias voltage-generating circuits for applying bias voltages to the sense amplifiers of the circuit in FIG. 7.
Figure 9A:
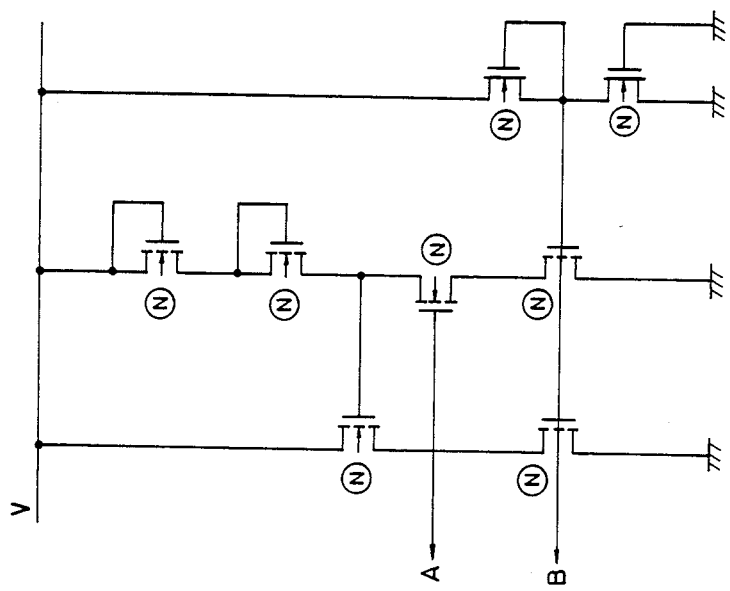

The contributing factors to inconsistent video signals of respective cells include mismatching the threshold voltages, the substrate effect, and the Early effect. Assuming that the transistors are of the same size and that the patterns are the same, the mismatching is usually caused by inconsistency of gate oxide fields, mobile ion density within the oxide fields and inconsistency of charge density within depletion layers, and inconsistent channel doping. These first and second inconsistencies may be eliminated by laying out transistors in proximity. In this embodiment, the third inconsistency is eliminated by fabricating the device with non-doped transistors. Because these non-doped transistors have threshold voltages of about zero volts, the bias voltage-generating circuits shown in FIG. 9(a) are employed. The transistors used in the bias voltage-generating circuits are MOSFETs, which are also non-doped. The connection between the transistor FT6 and the transistor FT7 minimizes the Early effect. A sense amplifier circuit A11 of the dummy cell W is also of the same construction as the sense amplifier circuit A1. The bias-voltage-generating circuits may be of a circuit shown in FIG. 9(b). The transistors FT3 and FT2 are used to reset the capacitive element C1 and to lock the photodiode PD1. The transistor FT3 may be omitted. Where the transistor FT3 is omitted, the transistor FT2 and the transistor FT1 go ON to reset the capacitance element C2, and the transistor FT2 goes ON to reset the photodiode PD1 and the transistor FT1 goes OFF to lock the photodiode PD1. Further, the transistor FT2 goes OFF and the transistor FT1 goes ON to accumulate a charge across the capacitance element C1. The above operation of the transistors also applied to the dummy cell W.

Thus, according to the solid image sensor in FIG. 7, it is possible to provide an accumulation period of respective detector cells such that they start and complete at one and the same point of time as the other detector cells. In addition, the length of the sensors may be set at will. Thus, all detector cells of the present invention provide video signals in synchronism with others. Further, the charge accumulation by the capacitance elements can prevent the saturation of the output and the long charge period can improve the sensitivity of the devices. Amplifiers for current amplification are provided in the proximity of the capacitance elements, and therefore the voltage across the capacitance element is output as a video signal from the amplifiers, the voltage being output from a voltage signal source with sufficiently low output impedance so that no voltage drop is caused even if a considerable amount of current is drawn. Thus, the voltage drop of the video signal due to charging the video line capacitance may be prevented, thus providing higher sensitivity.

The solid state image sensor in FIG. 7 comprises a detector cell which provides a video output in accordance with the level of charging of the capacitance element. The detector cell includes a series circuit connected in parallel with a photodiode, the series circuit consisting of a capacitance element and a switch element that is closed for at least a period of accumulating charge which is light-generated within the photodiode; a photodiode which intercepts incident light; and at least one dummy cell having a series circuit connected in parallel with the photodiode which intercepts incident light. The series circuit further consists of a second capacitance element and a switch element that is closed when the switch element in the detector cell is closed, and the dummy cell provides a dark signal in accordance with the charging level of the second capacitance element. Therefore, adverse effects due to the dark current of photodiodes may be eliminated from the video signal, thus providing a video signal with a high signal to noise ratio.

Additionally, eliminating the dark current permits the operation in high temperature environments as well as in wide temperature ranges.

Further, the elements in FIG. 7 include a first transistor to which a voltage is applied in accordance with a light-generated charge. A second transistor is inserted as a load resistor into a part of the circuit of the first transistor into which a carrier flows from outside, the second transistor having a threshold voltage which is balanced with the threshold voltage of the first transistor. An amplifying circuit outputs a video signal reflecting the potential of the junction point between the first and the second transistors. Thus, the threshold voltage of each transistor compensates one another to make the output signal independent of the transistors' threshold voltages. Therefore, each picture element provides a consistent video signal, which improves detection accuracy. Because the video signal is output to the video line from a signal source having a low internal impedance, the decrease in signal voltage due to the video line capacitance is eliminated, thereby improving detection sensitivity.

Figure 10:
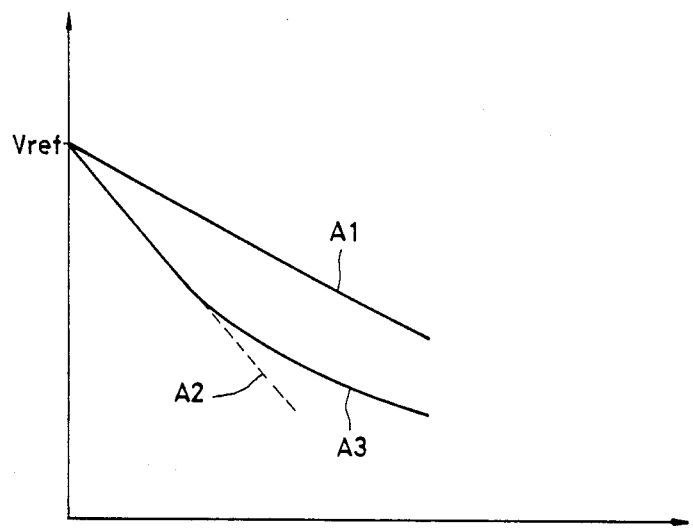
FIG. 10 shows a change in voltage across photodiodes in response to the amount of light received.

In the embodiment shown in FIG. 7, the voltage Vc across the capacitance element C1 is caused to decrease, as indicated by A1 in FIG. 10, in proportion to the light received during the information accumulation period, and the voltage Vc (refer to Eq. (1)) across the capacitance element C1, upon completion of the information accumulation period, is stored and maintained as picture element information.

Light incident upon a solid state image sensor enters through optical systems generally constructed with lenses and mirrors and has its intensity decreased thereby. As a result, the detector cell of the solid state image sensor with high sensitivity is desirable. To improve the sensitivity of the detector cell X1 of the solid state image sensor shown in FIG. 7, it is required to further increase, as marked by A2 in FIG. 10, the rate of change of the voltage Vc across the capacitance element C1 relative to the amount of light received IL·t. Increasing the rate of change of the voltage Vc relative to the amount of light received improves the light sensitivity characteristics of the detector cell X1, as seen from Eq. (1), the light-receiving area of the photodiode PD1 may be made large to accommodate more photoelectric current IL or the capacitance of the capacitance element C1 may be made small. However, the junction capacitance $C_D$ of a photodiode PD1 is proportional to the distance surrounding the photodiode PD1, and therefore increasing the area of the photodiode PD1 to handle more photoelectric current IL causes a larger junction capacitance $C_D$.

Further increases of the capacitance of the capacitance element C1 causes the junction capacitance $C_D$ to greatly influence the voltage Vc.

On the other hand, the junction capacitance $C_D$ varies depending on the voltage between the anode and the cathode of the photodiode PD1 as follows.

$$C_D = a\sqrt{1/(V+V_b)} \qquad (2)$$

where
$a$ is a constant;
$V_b$ is built-in potential; and
$V$ is the voltage applied across the photodiode PD1, which corresponds to the voltage Vc across the capacitance element C1 in the arrangement shown in FIG. 7.

Consequently, in an attempt to realize high sensitivity of the detector cell X1, if the area for receiving light is increased and the capacitance of the capacitance element C1 is decreased, then the voltage Vc is approximated as follows.

$$VC \simeq Vref - IL\cdot t\cdot\sqrt{V_o+V_b}/a \qquad (3)$$

In Eq. (3), if the built-in potential Vb is smaller than the voltage Vc, then the relation between the light received IL·t and the voltage Vc is not ideally linear as denoted by A2 in FIG. 10, but is actually nonlinear as denoted by A3 in FIG. 10.

With the solid state image sensors as shown in FIG. 7, there is a problem that the junction capacitance $C_D$ greatly influences the voltage Vc across the capacitance element C1 if the light-receiving area of the photodiode PD1 is increased and the capacitance of the capacitance element C1 decreased in an attempt to improve sensitivity, namely the distorting of the photoelectric conversion characteristics.

Figure 11:
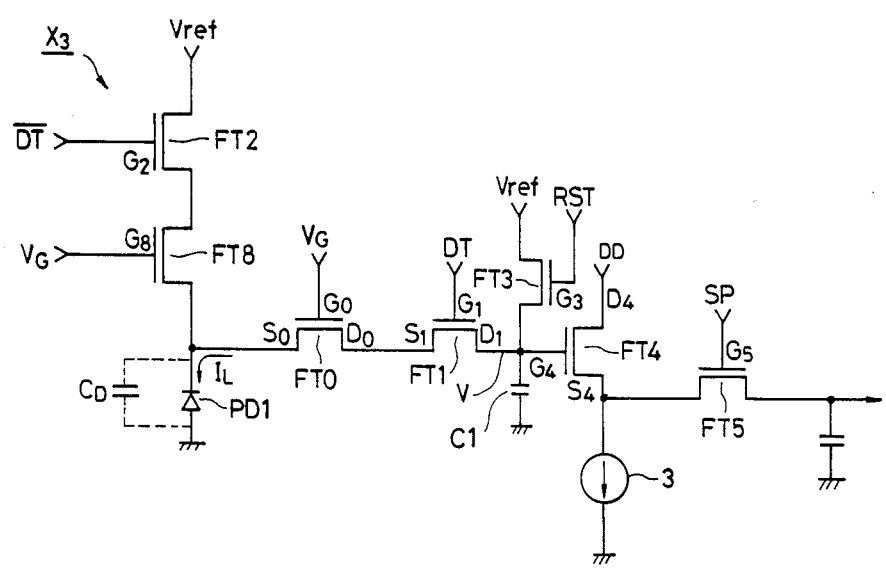
FIG. 11 is a diagram showing a third embodiment of the detector cell according to the invention.

FIG. 11 shows one type of solid state image sensor which is capable of reading out repeatedly and of providing photoelectric conversion characteristics with low distortion and high sensitivity.

In the embodiment shown in FIG. 11, the voltage across a capacitance element of a detector cell is predetermined. The photodiode is directly connected to the capacitance element with the aid of switching elements. As a result, the photoelectric current flows from the capacitance element to the photodiode in accordance with intensity of the light incident upon the photodiode, and the voltage across the capacitance element decreases with time i.e., with the amount of light received. It should be noted that a transistor is provided so that the voltage across the capacitance element is not applied to the photodiode directly. This transistor acts to eliminate influences of the junction capacitance of the photodiode on the voltage across the capacitance element and to apply the driving voltage to the photodiode. Thus, the voltage across the capacitance element, even when the light receiving area is increased and the junction capacitance is made large, decreases linearly during information accumulation period without influence from the junction capacitance. The voltage across the capacitance element when the information accumulation period is over is accumulated as picture element information, and the voltage accumulated is then output as picture element information from a current amplifying circuit. The voltage across the capacitance element is stored and maintained even after it is output from the current amplifying circuit.

With the detector cell X3 in FIG. 11, unlike the detector cell X2 in FIG. 7, a further transistor FT0 is provided between the photodiode PD1 and the switching element FT1. The transistor FT0 eliminates the influences of the junction capacitance $D_D$ on the voltage Vc across the capacitance element C1, and includes, for example, N-channel MOS transistors.

Figure 12:
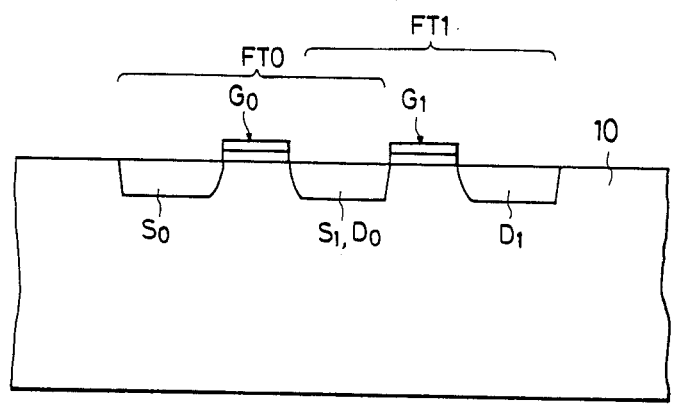
FIG. 12 is a diagram showing the connection between a switching element FT1 and a transistor FT0 of the detector cell shown in FIG. 11.

FIG. 12 shows the structure of the switching element FT1 and the transistor FT0. In FIG. 12, both switching element FT1 and transistor FT0 and N-channel MOS transistors formed on the same P-type semiconductor substrate 10. The source S1 of the switching element FT1 is in common with the drain $D_0$ of the transistor FT0. The gate $G_1$, the drain $D_1$ and the source of the switching element FT1 are self aligned. The gate $G_0$, the drain $D_1$ and the source $S_0$ of the transistor FT0 are also self aligned. By this arrangement, stray capacitances between $G_1$ and $D_0$, between $G_1$ and $D_1$, between $G_0$ and $S_1$, and between $G_0$ and $S_0$ are effectively prevented from being produced. The drain $D_0$ of the transistor FT0 is applied the voltage Vc across the capacitance element C1 when the switching element FT1 is on. Further, the gate $G_0$ of the transistor FT0 is applied a dc bias voltage $V_G$ when the device is used.

Figure 13:
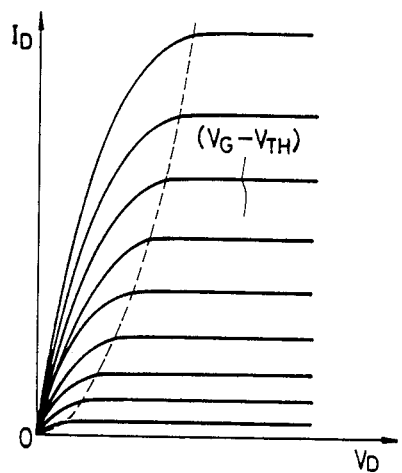
FIG. 13 is a diagram showing characteristics of conventional MOS transistors.

FIG. 13 shows output characteristics between drain voltage $V_D$ and drain current $I_D$ of a conventional MOS transistor with gate voltage $V_G$ as a parameter.

Additionally, if an enhancement type MOS transistor is provided, then a MOS threshold voltage $V_{TH}$ exists, and thus the true gate voltage is $(V_G - V_{TH})$. In FIG. 13, when the drain voltage $V_D$ is lower than the true gate voltage $(V_G - V_{TH})$, the output characteristics are linear while the output characteristics are saturated when the drain voltage $V_D$ is higher than the true gate voltage $(V_G - V_{TH})$. In this saturation region, the drain current $I_D$ varies in accordance with the true gate voltage $(V_G - V_{TH})$ but not in accordance with the drain voltage $V_D$.

The transistor FT0 in FIG. 11 is a MOS transistor having characteristics as shown in FIG. 13. Therefore, the drain voltage $V_D$ is equal to the voltage Vc across the capacitance element C1 and the drain current $I_D$ is equal to IL during information accumulation period i.e., when the transistor FT1 is on. When the transistor FT0 is to be used in the saturation region i.e., when the applied gate voltage $V_G$ and the voltage Vc are in the following relation:

$$V_G - V_{TH} < Vc \qquad (4)$$

the photodiode PD1 is regarded as being driven not by the voltage Vc across the capacitance element C1 but by the gate voltage $V_G$. More specifically, the current IL flowing through the photodiode PD1 in proportion to the incident light acts, during the information accumulation period, as a constant current source which draws charge from the capacitance element C1 via the switching element FT1 and the transistor FT0 to reduce the voltage Vc across the capacitance element C1. The voltage applied across the photodiode PD1 is not equal to the voltage Vc across the capacitance element C1 but is determined by the source voltage $V_{PD}$ and the gate voltage $V_G$ of the transistor FT0. That is, the source voltage $V_{PD}$ is expressed as follows:

$$V_{PD} = (V_g - V_{TH}) - \sqrt{2 \cdot I_{SH} \cdot L/(W \cdot \beta)} \qquad (5)$$

where L and W are channel length and channel width respectively, and $\beta$ is an amplification factor. The photoelectric current IL is caused by the true gate voltage $(V_G - V_{TH})$ and the source voltage $V_{PD}$. Although the voltage Vc across the capacitance element C1 decreases due to the photoelectric current IL caused by the photodiode PD1, the photodiode PD1 is regarded as being driven by the specific voltage $V_{PD}$ and $V_G$, and thus no current flows through the junction capacitance $C_D$ of the photodiode PD1. As a result, the influence of the junction capacitance $C_D$ of the photodiode PD1 on the voltage Vc can be eliminated. Further, with the detector cell X3 in FIG. 11, unlike the detector cell X2 in FIG. 7, the switching element FT2 which allows the photoelectric current to be generated except during the information accumulation period, is connected to the photodiode PD1 via a transistor FT8. To the gate G8 of the transistor FT8 is applied the same voltage $V_G$ as the gate voltage of the transistor FT0, and thus the voltage across the photodiode PD1 is also clamped at a low level for periods other than the charge accumulation period. This permits transistor FT8 to be ready to shift to the charge accumulation operation right after the switching element FT1 is turned on.

With the detector cell X3 thus arranged, prior to accumulation of picture element information, the switching element FT3 is turned on by being applied a reset signal RST, the voltage Vc across capacitance element C1 is then initially set to a reference potential Vref. In addition, the gate $G_0$ is applied the voltage $V_G$ such that $V_G$ satisfied the relation in Eq. (4) with respect to the expected voltage Vc at the end of the information accumulation period. Information accumulation signal DT is then applied to the switching element FT1 to cause the switching element FT1 to be on, thereby initiating accumulation of the picture element information across the capacitance element C1. During this information accumulation period, the photoelectric current IL generated within the photodiode in accordance with the light incident draws the accumulated charge across the capacitance element C1 to reduce the voltage Vc across the capacitance element C1 from the initial reference voltage Vref. In this embodiment, because of the transistor FT0, which operates in its saturation region, the voltage applied across the photodiode PD1 is maintained at a constant level even when the voltage Vc varies as mentioned above. Thus, no current flows into the junction capacitance $C_D$, thereby eliminating the adverse influences of the current from the junction capacitance $C_D$. Thus, the voltage Vc across the capacitance element C1 during information accumulation period is now expressed as follows:

$$Vc = Vref - IL \cdot t/C1 \qquad (6)$$

Note that the voltage Vc is not dependent on the junction capacitance $C_D$ but is dependent only on the photoelectric current IL and the capacitance of the capacitance element C1, varying linearly with time t i.e., the amount of light received. The proportionality between the amount of light received IL·t and the voltage Vc in Eq. (6) will not change even when the light-receiving area of the photodiode is increased to cause a larger junction capacitance, thus providing photoelectric conversion characteristics with low distortion and high sensitivity. In this manner, the picture element information is accumulated in the form of the voltage Vc across the capacitance element C1, the information accumulation signal DT is turned off, and the voltage Vc when the information accumulation period is over is stored and maintained. The inverted information accumulation signal DT is applied during all periods except during the information accumulation period, thus causing the photoelectric current to flow outside and thereby prevent blooming. The gate G8 of the transistor FT8 is applied voltage $V_G$ to clamp the voltage across the photodiode PD1 at low level, thereby permitting a transition to the charge accumulation operation when the switching element FT1 is turned on.

In the above described embodiment, the transistor FT0 is an N-channel enhancement type MOS transistor, the channel region of which is doped by P-type impurities to a predetermined concentration and therefore there exists a MOS threshold voltage $V_{TH}$. The MOS threshold voltage $V_{TH}$ may be controlled by selecting the concentratin of the impurities of the channel region. For example, a lower concentration of impurity provides a lower MOS threshold voltage $V_{TH}$ and, as is apparent from Eq. (4), a wider operation range of the voltage Vc across the capacitance element C1 may be obtained by further lowering the voltage $V_G$ of the gate $G_0$. For example, if the channel region is not doped by an impurity, then the operation range of the voltage Vc may be maximized, thereby providing stable drain current in the saturation region over practical operating range. Although increasing the light receiving area of the photodiode PD1 permits the characteristics with low distortion and high sensitivity, the dark current increases with an increase of the area, thus deteriorating the S/N ratio (signal to noise ratio).

Figure 14:
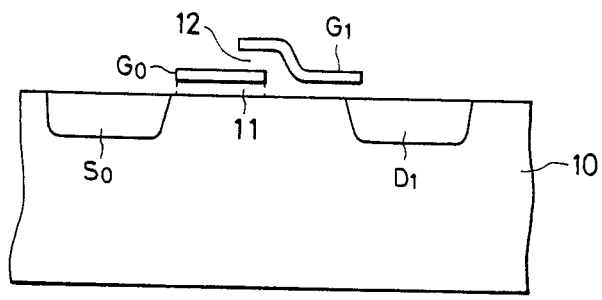
FIG. 14 illustrates a modification of the connection between the switching element FT1 and the transistor FT0 shown in FIG. 12.

Consequently, the area for receiving light can not be made so large to ensure characteristics with high sensitivity and good S/N ratio, as is apparent from Eq. (6), by making the capacitance of the capacitance element C1 small. However, when the capacitance element C1 is made smaller, a problem arises with stray capacitance in the circuit. For example, while it is possible to eliminate the capacitance between gate $G_1$, $G_0$ and drain $D_1$, $D_0$ and source $S_1$, $S_0$ of switching elements FT1 and FT0, a problem arises with the junction capacitance between P-type semiconductor substrate 10 and the drain $D_0$ in common with the source $S_1$, as shown in FIG. 12. FIG. 14 shows the connection between the switching element FT1 and the transistor FT0 which acts to eliminate the influence of the stray capacitance. In FIG. 14, the gate $G_1$ of transistor FT1 and the gate $G_0$ of the transistor FT0 overlap each other at dual polysilicon layers 11 and 12. By this arrangement, the stray capacitance due to the junction capacitance of the capacitance element C2 may be eliminated.

With the detector cell X2 shown in FIG. 11, on-off operation of the information accumulation signal DT applied to the gate G1 of the switching element FT1 may cause switching noise. In order to prevent switching noise, the connection of the switching element FT1 and the transistor FT0 in FIG. 11 and FIG. 12 may be interchanged. In other words, the photodiode PD1 may be connected to the source $S_1$ of the switching element FT1; the capacitance element C1 may be connected to the drain $D_0$ of the transistor FT0; and the drain $D_1$ of the switching transistor FT1 may be connected to the source $S_0$ of the transistor FT0. With this connection, the operation voltage of the transistor FT1 will be less than the gate voltage $V_G$ of the transistor FT0, and thus the amplitude of the information accumulation signal DT applied to the gate G1 of the switching element FT1 may be made lower, thereby reducing the switching noise. Further, the switching noise due to the switching element FT3 may be reduced by coupling capacitance that appears to be small by virtue of connecting the switching element FT3 to a dummy transistor (not shown).

According to the embodiment described above, it is possible to obtain photoelectric conversion characteristics with less distortion and higher sensitivity as well as a good S/N ratio. According to the present invention, influences of the junction capacitance of the photodiode on the voltage across the capacitance element may be eliminated, and a transistor for applying essential voltage across the photodiode is further provided within the detector cell which is capable of repetitive reading out, thereby providing a solid state image sensor capable of repetitive reading out and having photoelectric conversion characteristics such as low distortion and high sensitivity.

The detector cell X3 of a solid state image sensor shown in FIG. 11 is arranged such that the voltage Vc across the capacitance element C1 decreases during the information accumulation period in proportion to the amount of light received as shown in Eq. (6). The voltage Vc of the capacitance element C1, when the information accumulation period is over, is then stored and maintained as a picture element. It should be noted that the source follower circuit in FIG. 11 consisting of the transistor FT4 and the constant current source 3 takes advantage of saturation characteristics of MOS transistors. Thus the output voltage of the source follower or the output voltage $V_{OUT}$ from the source $S_4$ of the transistor FT4 is given as follows:

$$V_{OUT} = Vc - V_1 - (V_{t4} - V_{t5}) \tag{7}$$

where $\dot{V}c$ is voltage across the capacitance element;

$V_1$ is the gate voltage of a transistor FT6 and a transistor FT7 constituting the constant current source 3;

$V_{t4}$ is the threshold voltage of the transistor FT4; and $V_{t5}$ is the threshold voltage of the transistors FT6 and FT7 constituting the constant current source 3.

Figure 15:
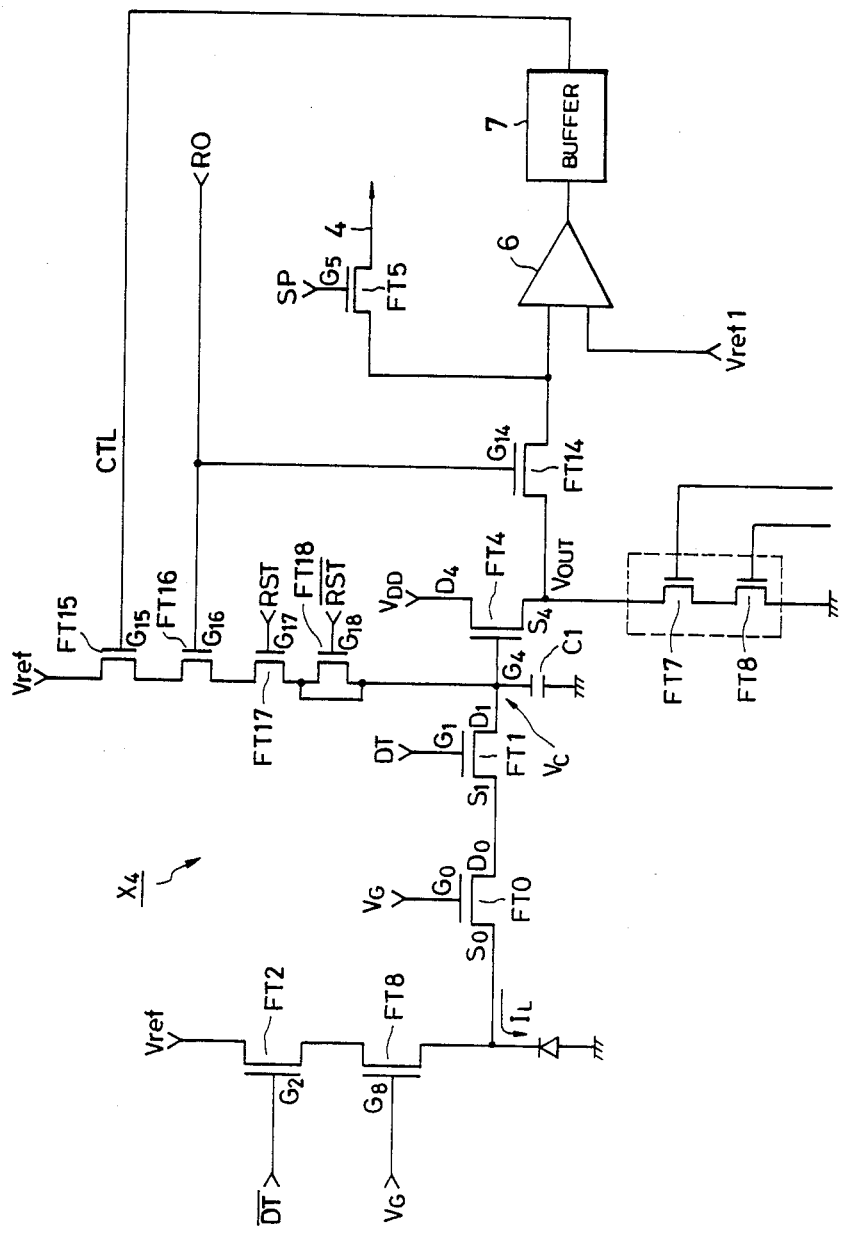
FIG. 15 is a diagram showing a fourth embodiment of a detector cell of a solid state image sensor according to the invention.

Additionally, $(V_{t4} - V_{t5})$ in FIG. (7) is an offset voltage $\Delta V$. It is desirable that the offset voltage $\Delta V$ is eliminated from the output voltage $V_{OUT}$ for an improved S/N ratio. However, a problem occurs in that it is difficult to realize an offset voltage of less than 3 to 5 mV under any fabrication conditions, and thus the S/N ratio of the picture element information can be improved up to a certain level. FIG. 15 shows a solid state image sensor that provides an improved S/N ratio of the picture element by further lowering the offset voltage.

With the detector cell X4 in FIG. 15, the voltage across the capacitance element is initially set to a predetermined value, then the direct connection between the capacitance element and the photodiode is established by means of a switching means to cause the voltage across the capacitance element to decrease by a potential difference in accordance with the amount of light received, thereby accumulating the picture element information. When the information accumulation period is over, the voltage across the capacitance element can be output through a current amplifying means while the voltage remains stored and maintained. It should be noted that when the current amplifying means is formed of, for example, MOS transistors, the output voltage of the current amplifying circuit is shifted with respect to the voltage across the capacitance element by the offset voltage resulting from the threshold voltage of the MOS transistors. In order to eliminate the influence of the offset voltage on the output voltage of the current amplifying means, a means is provided for initially setting the output voltage of the current amplifying circuit to the voltage across the capacitance element. Thus, the initial voltage across the capacitance element is compensated by the offset voltage with respect to the value to which it would be set if there was no influence of the offset voltage of the current amplifying means. By virtue of this compensation, when the picture element information or the voltage across the capacitance element is output after the picture element information accumulation period, the voltage across the capacitance element may be output as the output voltage of the current amplifying element, the voltage being free from the influence of the offset voltage.

The embodiment of FIG. 15 will now be described in detail with reference to the drawings.

FIG. 15 shows a solid state image sensor according to the present invention. With the detector cell X4 in FIG. 15, the capacitance element C1 is connected in series with switching elements FT15, FT16, FT17, and FT18 formed of MOS transistors, and the voltage Vc across the capacitance element C1 is initially set to the reference voltage Vref when all of the switching elements FT15 through FT18 are on. The gate $G_{15}$ of the switching element FT15, as will be described later, is applied a control signal CTL from a buffer 7, which causes the capacitance element C1 to accumulate charge until the reference voltage Vref1 is equal to the output $V_{OUT}$ of a current amplifying means or a source follower which consists of the transistor FT4 and the constant current source 3. The gate $G_{16}$ of the switching element FT16 is applied an output signal RO from a shift register (not shown), which switching element FT16 is adapted to control the accumulation of charge in response to the output signal RO of the shift register. The gate $G_{17}$ of the switching element FT17 and the gate $G_{18}$ of the switching elements FT18 are applied a reset signal RST and an inverted reset signal RST, respectively, which switching elements FT17 and FT18 do not allow signal RO to affect the voltage Vc when charge is accumulated across the capacitance element 5. The output terminal of the source follower circuit or terminal of the source S4 of the transistor FT4 is connected to one of the input terminals of a comparator 6 via the switching element FT14, while also it is connected to the video line 4 via the switching element FT5.

Additionally, the gate G14 of the switching element FT14 is applied the output signal RO of the shift register, and the gate G5 of the switching element FT5 is applied a read out signal SP. The other output terminal of the comparator 6 is applied a reference voltage Vref1, and the output terminal of the comparator 6 is connected to the gate G15 of the switching element FT15 via a buffer 7 as described above.

FIGS. 16(a)–16(f) show the operation of the detector cell X4 of a solid state image sensor of the above arrangement. First, the reset signal RST is applied as shown in FIG. 16(a) to turn on the transistor FT17, thereby initiating the initial setting of the voltage Vc across the capacitance element C1. When the reset signal RST is output, the first pulse ISP1 of the internal start pulses ISP as shown in FIG. 16(b) is applied to a shift register (not shown) which applies, in synchronism with a clock signal CK, the output signal RO to the gates G14 of the switching element FT14 and the gate G16 of the switching element FT16 to turn on the switching elements FT14 and FT16, respectively.

FIG. 16(c) shows the output signal RO of the shift register applied in sequence to a plurality of detector cells within a solid state image sensor. The reference voltage Vref1 is set to the reference voltage Vref during the initial setting of the voltage Vc. The comparator 6 then compares the output voltage $V_{OUT}$ of the source follower with the reference voltage Vref1 or Vref to monitor whether or not the output $V_{OUT}$ is equal to the reference voltage Vref.

If the voltage $V_{OUT}$ is less than the reference voltage Vref, then the voltage Vc across the capacitance element C1 has not reached the initial setting level, and the comparator 6 outputs a control signal CTL to turn on the switching element FT15 via a buffer 7. Thus, if the voltage Vc across the capacitance element C1 has not reached the initial setting level, the capacitance element C1 continues to be applied the reference voltage Vref via the switching elements FT15, FT16, FT17 and FT18. If the output voltage is equal to the reference voltage Vref, then the voltage Vc across the capacitance element C1 has reached the initial setting level and the control signal CTL turns off the switching element FT15 to terminate the initial setting of the voltage Vc of the capacitance element C1.

In this embodiment, the output voltage $V_{OUT}$ of the source follower circuit is compared with the reference voltage Vref. Thus, when the initial setting is completed, the voltage Vc across the capacitance element C1 is not equal to the voltage Vref but is equal to the voltage obtained by compensating for the offset voltage $\Delta V$ of the MOS transistor of the source follower. Consequently, the offset voltage may be eliminated from the output voltage $V_{OUT}$ of the source follower.

In this manner, the voltage Vc across the capacitance element C1 is initially set so that the output voltage $V_{OUT}$ of the source follower is equal to the reference voltage Vref, and then the information accumulation signal DT shown in FIG. 16(d) is applied to the switching element FT1 for a predetermined period of time. Thus, the operation for accumulating information in the capacitance element C1 is carried out.

The voltage Vc across the capacitance element C1 varies linearly with the amount of light received IL·t during the information accumulation period, as shown in Eq. (6). Additionally, Vref in Eq. (6) is actually the voltage compensated by the offset voltage for initial setting in this embodiment.

The picture element information is accumulated in the form of the voltage Vc across the capacitance element C1 during the information accumulation period and thereafter the information accumulation signal DT is off. The voltage Vc at the end of the information accumulation period is stored and maintained as picture element information. The read out signal SP, shown in FIG. 16(e), is then applied to the gate G5 of the switching element FT5 to initiate reading out of the picture element information accumulated as the voltage Vc across the capacitance element C1. The second pulse ISP2 of the internal start pulses ISP is applied, upon the read out signal SP, to the shift register as shown in FIG. 16(b), and the shift register outputs the output signal RO.

The switching element FT14 turns on upon the output signal RO being set high and the switching element FT5 is turned on upon the read out signal SP being set high. Thus, the voltage Vc accross the capacitance element is output in the form of output voltage $V_{OUT}$, which has been compensated by the offset voltage $\Delta V$ of the MOS transistor of the source follower circuit. Because the voltage Vc across the capacitance element, when initialized, is compensated by the offset voltage $\Delta V$, the output voltage $V_{OUT}$ is output to the video line 4 in the form of a picture element, the voltage of which is offset by the offset voltage $\Delta V$. The influence of the offset voltage on the output voltage $V_{OUT}$ may be reduced considerably to greatly improve the S/N ratio of the picture element that is to be read out.

The solid state image sensor thus described is of a type in which the transistor FT0 eliminates influence of the junction capacitance of the photodiode on the voltage Vc across the capacitance element C1. However, the invention can also be applied to a solid state image sensor of a type in which the transistor FT0 is not provided and the charge accumulated within the capacitance element C1 is allowed to flow as photoelectric current through the photodiode PD1 via the switching element FT1.

As described above, according to the embodiment shown in FIG. 15, the initial setting of the voltage across the capacitance element C1 permits the device to output the voltage across the capacitance element as a picture element without influence of the offset voltage to thereby greatly improve the S/N ratio of the picture element.

With the detector cell X3 shown in FIG. 11, the voltage across the capacitance element C1 is decreased in proportion to the amount of light received in accordance with Eq. (6) to thereby obtain picture element information with high sensitivity, which is particularly applicable to single-lens reflex cameras. It should be noted that where a solid state image sensor having a detector cell X3 as shown in FIG. 11 is applied to a light receiving element of a camera to form a range finder, the light aligned with the optical axis can be directed to the solid state image sensor if the camera is a single-lens reflex camera but a light source 20, as shown in FIG. 17, is further required if the camera is a lens shutter camera or the like, which has no mechanism for aligning the optical axis.

Referring to FIG. 17, an infrared light emitting diode, for example, is used as a light source 20 to project the infrared light from the light source toward a subject 22 through a project lens 21. The infrared light reflected by the subject 22 is condensed via a condenser lens 23 onto a light receiving element or solid state image sensor 24 for range finding. However, a problem occurs when the infrared light emitting diode, used as a light source 20 for projection, is used for range finding, namely that the solid state image sensor 24 receives light (referred to non-signal light hereinafter) other than the reflected signal light which deteriorates the performance of the range finding of the solid state image sensor 24. More specifically, where the detector cell of the solid state image sensor 24 is realized by the detector cell X3 as shown in FIG. 11, the voltage Vc across the capacitance element C1 varies in accordance with the intensity of the non-signal light and signal light which is incident upon the photodiode PD1. Thus, the longer the distance to the subject 22, the weaker the intensity of the signal light to the non-signal light becomes, thus deteriorating the S/N ratio. A distance of approximately 10 meters between the subject 22 and the light source 20 is the maximum measuring distance if the camera has no mechanically movable portions.

Figure 18:
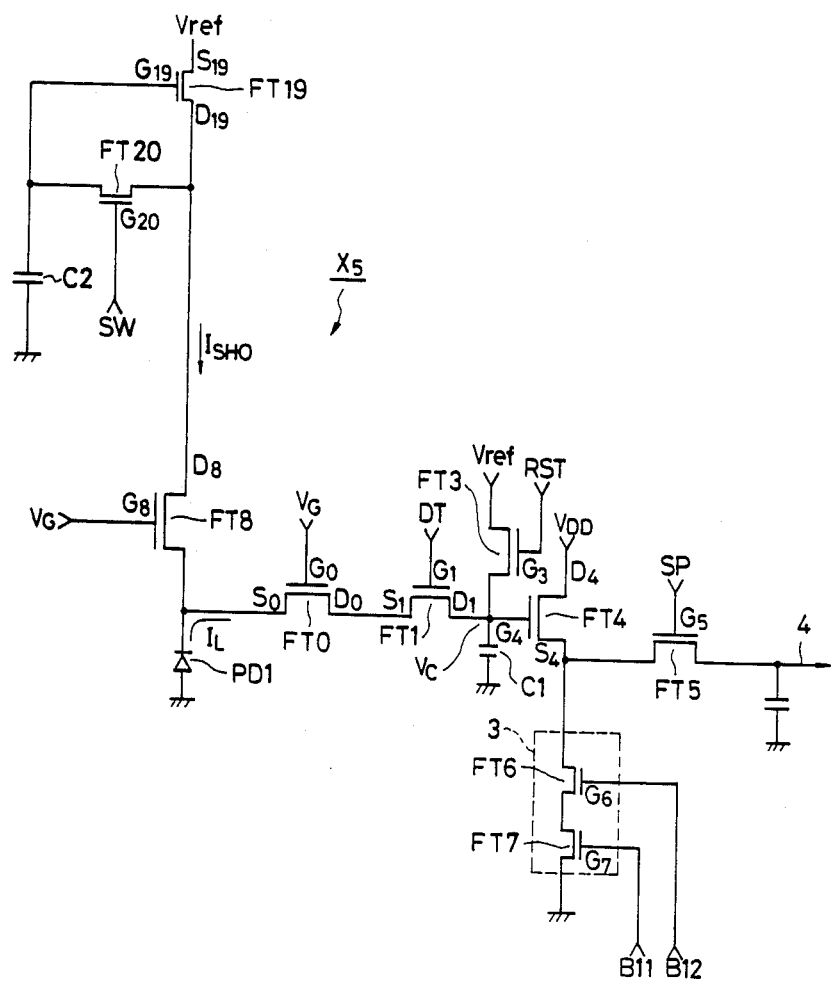
FIG. 18 shows the arrangement of a fifth embodiment of the detector cell of a solid state image sensor according to the invention.

FIG. 18 shows a detector X5 of a solid state image sensor which is capable of eliminating the influence of non-signal light and is also capable of range-finding where the distance to the subject is long.

The detector cell X5 shown in FIG. 18 is characterized in that the detector comprises a photodiode upon which light is incident, a capacitance element, a switching element which effectively connected the photodiode to the capacitance element during the information accumulation period, and a current amplifying circuit which outputs the voltage across the capacitance element as a picture element. The photodiode is connected to a non-signal light memory means which stores the voltage corresponding to the photoelectric current due to the non-signal which is light-generated within said photodiode and is supplied by the voltage stored in said non-signal light memory means for a period during which the information is accumulated in the capacitance element in accordance with the photoelectric current of the signal light-generated within the photodiode.

With the solid state image sensor in FIG. 18, the switching element is set to off prior to range finding to effectively separate the photodiode from the capacitance element. The voltage across the capacitance element is initially set to a predetermined value.

Further, before starting range finding or distance measurement, non-signal light is incident upon the photodiode. The photoelectric current generated by this non-signal light is stored in the form of voltage in the non-signal light memory means. A light signal for range finding, which is emitted from the light emitting diode and is reflected by a subject, is allowed to be incident upon the photodiode. The switching element is caused to be on to establish effective direct connection between the photodiode and the capacitance element to thereby accumulate the photoelectric current of the photodiode generated by signal light as picture element information across the capacitance element. It should be noted that during the range finding or information accumulation period, the signal light as well as non-signal light is incident upon the photodiode. When information resulting from the non-signal light as well as the signal light is accumulated across the capacitance element, a long distance to the subject and a signal light with less intensity than the non-signal light will cause deteriorated S/N ratio, thus disturbing accurate range finding. Consequently, the invention allows the voltage stored in the non-signal light memory means to supply a photoelectric current generated by the non-signal light as well as by the signal light incident upon the photodiode, thereby preventing accumulation of information resulted from the non-signal light across the capacitance element. Thus, only information resulting from signal light is accumulated across the capacitance element. Where the distance to the subject is long, the information is read out from the current amplifying circuit or the source follower circuit, thereby providing accurate range finding.

The embodiment in FIG. 18 will be described in detail with reference to the drawings. With the detector cell X5 shown in FIG. 18, the drain D8 of a transistor FT8 is connected to a P-channel type MOS transistor FT19. The source S19 of transistor FT19 is maintained at Vref, and its gate G19 is connected to a capacitance element C2. Further, an N-channel type MOS transistor FT20 is connected between the gate G19 and the drain D19 of MOS transistor FT19. A switch signal SW is applied to the gate G20 of the MOS transistor FT20, thus causing the gate G19 and the drain D19 of the MOS transistor FT19 to effectively connect or disconnect one from the other.

Where a solid state image sensor having the detector X5 thus arranged is to be used as a light receiving element 24, as shown in FIG. 17, the charge within the photodiode resulting from photoelectric current caused by non-signal light is stored in the capacitance element C2 prior to measuring the distance to the subject. More specifically, the information accumulation signal DT is not output so that the photodiode is effectively disconnected from the capacitance element C1. Further, the reset signal RST is applied to the gate G3 of the switching transistor FT3 to perform initial setting of the voltage across the capacitance element C1 to the reference voltage Vref.

Likewise, the light source 20 of the infrared light emitting diode is not driven, nor is the signal light allowed to be incident upon the photodiode PD1, but only the non-signal light is directed to the photodiode PD1. In addition, the switch signal SW is set to a high level to cause the MOS transistor 20 to be on. With the conditions thus set, the MOS transistor 19 acts as a load having a certain resistance, and the photoelectric current IL resulting from the non-signal light within the photodiode is supplied from the reference voltage Vref and then flows into the photodiode PD1 through the MOS transistor FT19 and the transistor FT8.

Note that the photodiode PD1 is effectively disconnected from the capacitance element C1, and thus the voltage across the capacitance element C1 is equal to Vref. Also, owing to the photoelectric current caused by the non-signal light, the voltage across the capacitance element C2 is less than the voltage Vref by the voltage drop across the MOS transistor FT19. Thus, a charge accumulates across the capacitance element C2 in proportion to the photoelectric current resulting from the non-signal light. Therefore, when the charge accumulated in the capacitance element C2 is saturated, the switch signal SW is set low to cause the MOS transistor FT20 to store the charge resulting from the photoelectric current in the capacitance element C2.

As a result, the photoelectric current resulting from non-signal light can be stored in the form of the gate voltage of the transistor FT19. Accumulation of the signal light or picture element information can then be initiated. The light source 20 is driven to cause the signal light to be incident upon the photodiode PD1, while at the same time the information accumulation signal DT is applied to the gate G1 of the switching element FT1 to cause it to be on, thereby establishing effective direct connection between the capacitance element C1 and the photodiode PD1. The non-signal light is incident upon the photodiode PD1 in superimposition with the signal light and the photoelectric current IL due to the non-signal light flows in accordance with the voltage stored at the gate G19 of the MOS transistor FT19. Thus, it is only the photoelectric current IL' resulting from the signal light that flows from the capacitance element C1 into the photodiode PD1. Therefore, the voltage Vc across the capacitance element C1 decreases from the initial value Vref in accordance with only the photoelectric current IL' resulting from signal light as shown in Eq. (6), and is thus responsive to only the intensity of the signal light without influence of the non-signal light. In this manner, the voltage Vc across the capacitance element C1 is read out to the video line 4, as described previously, via the current amplifying circuit constituted by the transistor FT4 and the constant current source 3 i.e., the source follower and the switching transistor FT5.

Figure 19:
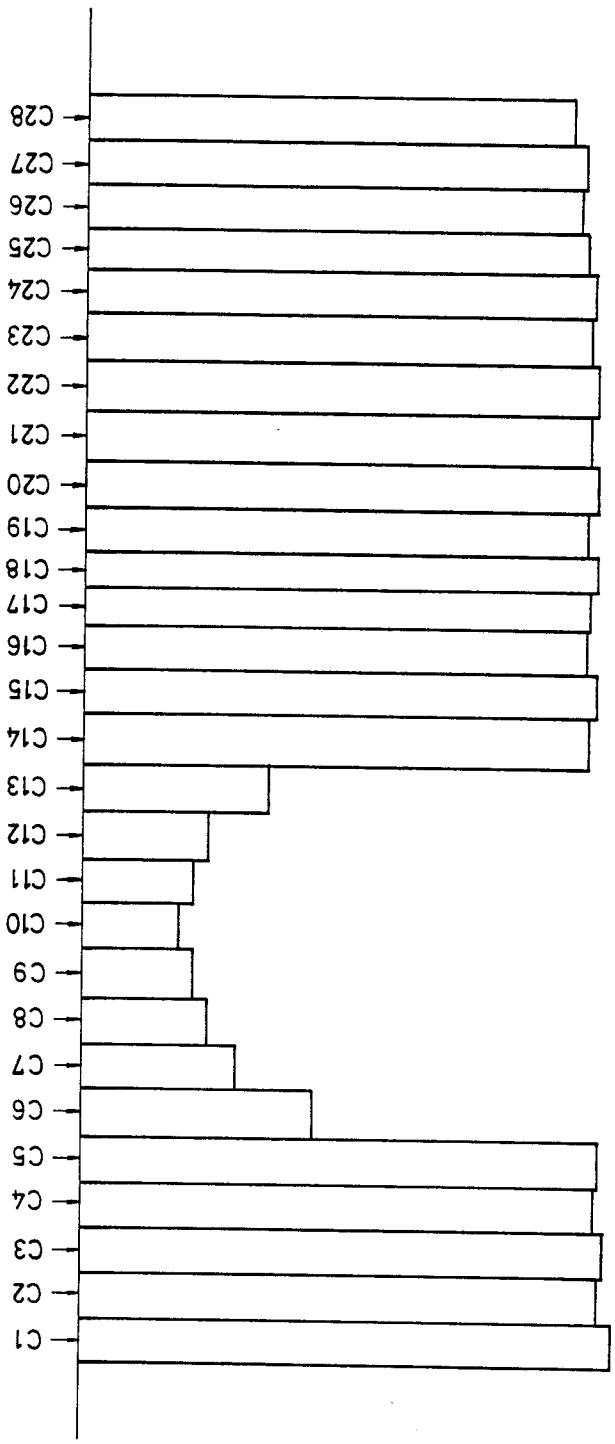
FIG. 19 shows voltage outputs that are read out of the capacitance elements of a plurality of the detector cells of a solid state image sensor of the embodiment in FIG. 18.

The solid state image sensor of the present invention is arranged by disposing a plurality of the detector cells X4 in one dimension or two dimensions. FIG. 19 shows the voltages Vc when they are read out to the video line 4 from plural capacitance elements C1 to C28, disposed in one dimension, of the solid state image sensor of the invention. Referring to FIG. 19, the detector cells C1 to C5 and C14 to C28 are not applied the signal light but the detector cells C6 to C13 are applied the signal light. As is apparent from FIG. 19, influences of the non-signal light on the voltage Vc across capacitance elements C21 to C28 are prevented in the present invention to thereby distinguish clearly the output of the detector cell when the signal light is incident upon the image sensor from the output of the detector cell when the signal light is not incident upon the image sensor.

Thus, it is possible to detect photoelectric current with high sensitivity with signal light applied, thereby providing a wider range of distance measurement.

Previously, the limit of range finding or distance measurement provided by semiconductor position sensor devices was about 10 meters when signal light induced about 1 nanoampere. In such a device the diameter of signal light spot is about 1 mm. Therefore, if a detector cell of a size of 50×100 μm is used, then the photoelectric current is 157 picoamperes.

Because the present invention can provide a solid state image sensor having sensitivity of about 60V/lux-second, light as low as 1 lux can be detected provided that the total light-emitting time of the light source 20 is 5 ms and the peak voltage is 0.3 volts. If the size of the solid state image sensor of the invention is as large as a conventional one i.e., 50×100 μm, the photoelectric current obtained from light of 1 lux is approximately 6.3 picoamperes. Thus, detector sensitivity can be 25 times higher than with conventional types and the limit of distance measurement is approximately 5 times further. Thus, distance measurements of 30 to 50 meters are made possible.

As thus far described, according to the embodiment shown in FIG. 18, since non-signal light memory means is provided for storing the voltage in accordance with the photoelectric current resulting from non-signal light during the period during which information of signal light is accumulated across the capacitance element, only information resulting from the signal light is accumulated in the capacitance element and the influences of the non-signal light are eliminated. Thus, where the distance to the subject is long, accurate distance measurement is still possible.

Previously known MOS image sensors or CCD image sensors do not provide this function. This function is particularly effective when applied to devices not capable of optical axis alignment.

It will be apparent to those skilled in the art that modifications and variations can be made in the solid state image sensor of this invention. The invention in its broader aspects is not limited to the specific details, represented of methods and apparatus, and the illustrative examples shown and described. Departures may be made from such details without departing from the spirit or scope of the invention.

What is claimed is:

1. A solid state image sensor having a plurality of detector cells and outputting a video signal in accordance with a charge that is light-generated in a photoelectric conversion element provided in each of said detector cells, said solid state image sensor comprising:
    capacitance means for accumulating said light-generated charge;
    first switching means, connected in series with said capacitance means, for controlling current flow through said capacitance means, said first switching means being closed to permit current to flow to said capacitance means at least when during a period of accumulating charge said capacitance means accumulates said light-generated charge, said first switching means and said capacitance means forming a series circuit connected in parallel with said photoelectric conversion element; and
    video output means for outputting a video signal in accordance with the amount of charge accumulated in said capacitance means.

2. A solid state image sensor according to claim 1, wherein prior to said period of accumulating charge, said photoelectric conversion element receives a reverse voltage, said capacitance means being charged by said reverse voltage.

3. A solid state image sensor according to claim 1, wherein either of said capacitance means and said photoelectric conversion element is connected to a reference voltage via a second switching means.

4. A solid state image sensor according to claim 3, wherein said second switching means is closed to apply a reverse reference voltage to said photoelectric conversion element except during said period of accumulating charge.

5. A solid state image sensor according to claim 1, wherein said video signal is output in the form of the charge across said capacitance means.

6. A solid state image sensor according to claim 1, further comprising amplifying means for amplifying the charge across said capacitance means.

7. A solid state image sensor according to claim 6, wherein prior to said period of accumulating charge, said photoelectric conversion element receives a reverse voltage, said capacitance means being charged by said reverse voltage.

8. A solid state image sensor according to claim 3, wherein either of said photoelectric conversion element and said capacitance means is connected to a reference voltage via said second switching means.

9. A solid state image sensor according to claim 8, wherein except for said period of accumulating charge, said second switching means is closed to apply a reverse reference voltage to said photoelectric conversion element.

10. A solid state image sensor according to claim 6, wherein said amplifying means comprises:
    a first transistor, said first transistor applying a voltage to an input terminal of said amplifying means in accordance with said light-generated charge; and
    a second transistor connected to said first transistor and operating as a load, said second transistor having a threshold balanced with the threshold of said first transistor, wherein
    the voltage at the junction point of said first transistor and said second transistor comprises said video signal.

11. A solid state image sensor according to claim 10 wherein said first transistor and said second transistor are non-doped MOS field effect transistors having the same threshold voltage.

12. A solid state image sensor according to claim 11, wherein the length of the channel of said second transistor is more than 5 $\mu$m.

13. A solid state image sensor according to claim 10, wherein said photoelectric conversion element is connected in parallel with a series circuit of a capacitance element and a switch element, said switch element being closed for at least said period of accumulating charge and wherein the voltage across said capacitance means is input to said second transistor.

14. A solid state image sensor according to claim 10, wherein prior to the period of accumulating charge, said photoelectric conversion element receives a reverse voltage, said capacitance means being charged by said reverse voltage.

15. A solid state image sensor according to claim 1, further comprising:
    at least one dummy cell having a photoelectric conversion element, said element intercepting light; and
    a series circuit comprising a capacitance element and a third switching means, said series circuit being closed for a period during which said third switching means is closed, said series circuit being connected in parallel with said photoelectric conversion element, and said at least one dummy cell outputting a dark signal in accordance with the charge accumulated in said capacitance means.

16. A solid state image sensor according to claim 15, wherein prior to said period of accumulating charge, said photoelectric conversion element in said detector cells and said photoelectric conversion element in said dummy cell receive a reverse voltage, said capacitance element being charged by said reverse voltage.

17. A solid state image sensor according to claim 15, wherein any of said photoelectric conversion element and said capacitance element in said detector cells and said dummy cell is connected to a reference voltage through said third switching means.

18. A solid state image sensor according to claim 17, wherein said third switching means connected to said photoelectric conversion element is closed to apply the reverse reference voltage except during said period of accumulating charge.

19. A solid state image sensor according to claim 15, wherein either of said video signal and said dark signal is output in the form of the charge across said capacitance means.

20. A solid state image sensor according to claim 15, wherein said detector cells and said dummy cell each have an amplifying circuit for amplifying the charge across said capacitance means.

21. A solid state image sensor according to claim 6, further comprising:
a transistor (FT0) for eliminating influences of junction capacitance on the charge across said capacitance means.

22. A solid state image sensor according to claim 21, wherein said transistor is a MOS transistor and a predetermined voltage is applied to the gate of said transistor to operate said transistor in the saturation region thereof.

23. A solid state image sensor according to claim 22, wherein said MOS transistor is of an enhancement type.

24. A solid state image sensor according to claim 21, wherein said transistor and said first switching means are N-channel MOS transistors, the sources of said transistors being connected to said photoelectric conversion element, and the drains of said transistors being connected to said capacitance means and the source of said first switching means.

25. A solid state image sensor according to claim 24, wherein the gates of said transistors and the gate of said first switching means overlap in part and define a space therebetween, said space comprising dual layers of polysilicon.

26. A solid state image sensor according to claim 21, wherein said transistor and said first switching means are N-channel MOS transistors, the drains of said transistors being connected to said capacitance means, the source of said first switching means being connected to said photoelectric conversion element, and the source of said transistor and the drain of said first switching means being connected to each other.

27. A solid state image sensor according to claim 21, wherein a transistor (FT8) is connected to said photoelectric conversion element to clamp the charge across said photoelectric conversion element to a low level when said capacitance means is not accumulating charge.

28. A solid state image sensor according to claim 6, wherein said detector cells further comprises an initial setting means for making reference to the output voltage of the current amplifying means to initially set the charge across said capacitance means.

29. A solid state image sensor according to claim 28, wherein said initial setting means includes compare means for comparing the output of said amplifying means and the reference voltage to initially set the voltage across said capacitance means to compensate for an offset voltage of said amplifying means.

30. A solid state image sensor according to claim 6, wherein said photoelectric conversion element of said detector cells is connected to a non-signal light memory means for storing voltage in accordance with photoelectric current resulting from non-signal light, the photoelectric current resulting from the non-signal light being supplied by voltage stored in said non-signal light memory means.

31. A solid state image sensor according to claim 1, further comprising:
a MOS transistor connected to a drain of said photoelectric conversion element, the source of said MOS transistor being held at reference voltage;
a capacitance element connected to the gate of said MOS transistor; and
a switching element connected between the gate and drain of said MOS transistor.

* * * * *

UNITED STATES PATENT AND TRADEMARK OFFICE
CERTIFICATE OF CORRECTION

PATENT NO. : 4,839,735

DATED : June 13, 1989

INVENTOR(S) : Mikio Kyomasu et al.

It is certified that error appears in the above-identified patent and that said Letters Patent is hereby corrected as shown below:

Claim 1, column 21, line 25, "when" should appear on line 26, following --charge--.

Abstract, line 3, change "lenngth" to --length--.

Signed and Sealed this

Twenty-eighth Day of August, 1990

Attest:

HARRY F. MANBECK, JR.

*Attesting Officer*  *Commissioner of Patents and Trademarks*